United States Patent
Graumann (10) Patent No.: US 11,086,716 B2
(45) Date of Patent: Aug. 10, 2021

(54) MEMORY CONTROLLER AND METHOD FOR DECODING MEMORY DEVICES WITH EARLY HARD-DECODE EXIT

(71) Applicant: Microchip Technology Inc., Chandler, AZ (US)

(72) Inventor: Peter John Waldemar Graumann, Calgary (CA)

(73) Assignee: Microchip Technology Inc., Chandler, AZ (US)

(*) Notice: Subject to any disclaimer, the term of this patent is extended or adjusted under 35 U.S.C. 154(b) by 0 days.

(21) Appl. No.: 16/790,547

(22) Filed: Feb. 13, 2020

(65) Prior Publication Data

US 2021/0028795 A1 Jan. 28, 2021

Related U.S. Application Data

(60) Provisional application No. 62/878,280, filed on Jul. 24, 2019.

(51) Int. Cl.
*G06F 11/10* (2006.01)
*H03M 13/11* (2006.01)
(Continued)

(52) U.S. Cl.
CPC ...... *G06F 11/1052* (2013.01); *G06F 11/1044* (2013.01); *G06F 11/1068* (2013.01);
(Continued)

(58) Field of Classification Search
CPC .................. G06F 11/1052; H03M 13/1177
See application file for complete search history.

(56) References Cited

U.S. PATENT DOCUMENTS

| 7,139,312 B2 | 11/2006 | Graumann |
| 7,415,584 B2 | 8/2008 | Gibb et al. |

(Continued)

OTHER PUBLICATIONS

Invitation to Pay Additional Fees and, Where Applicable, Protest Fee, PCT/US2020/021289, European Patent Office, dated Jun. 6, 2020.

(Continued)

*Primary Examiner* — Joseph D Torres
(74) *Attorney, Agent, or Firm* — Glass and Associates; Kenneth Glass (57) ABSTRACT

A method and apparatus for decoding are disclosed. The method includes receiving a first Forward Error Correction (FEC) block of read values, starting a hard-decode process in which a number of check node failures is identified and, during the hard-decode process comparing the identified number of check node failures to a decode threshold. When the identified number of check node failures is not greater than the decode threshold the hard-decode process is continued. When the identified number of check node failures is greater than the decode threshold, the method includes: stopping the hard-decode process prior to completion of the hard-decode process; generating output indicating that additional reads are required; receiving one or more additional FEC blocks of read values, mapping the first FEC block of read values and the additional FEC blocks of read values into soft-input values; and performing a soft-decode process on the soft-input values.

20 Claims, 7 Drawing Sheets

(51) Int. Cl.
*H03M 13/41* (2006.01)
*H03M 13/43* (2006.01)
*H03M 13/01* (2006.01)
*H03M 13/25* (2006.01)

(52) U.S. Cl.
CPC ..... *H03M 13/015* (2013.01); *H03M 13/1177* (2013.01); *H03M 13/258* (2013.01); *H03M 13/4138* (2013.01); *H03M 13/43* (2013.01)

(56) References Cited

U.S. PATENT DOCUMENTS

| | | | |
|---|---|---|---|
| 7,428,564 B2 | 9/2008 | Gibb et al. |
| 7,916,641 B2 | 3/2011 | Bourlas et al. |
| 7,961,593 B2 | 6/2011 | Porat et al. |
| 8,196,024 B2 | 6/2012 | Asirvatham et al. |
| 8,386,870 B2 | 2/2013 | Graumann |
| 8,509,073 B2 | 8/2013 | Bourlas et al. |
| 8,594,135 B2 | 11/2013 | Porat et al. |
| 8,625,498 B2 | 1/2014 | Bourlas et al. |
| 8,631,309 B2 | 1/2014 | Graumann et al. |
| 8,639,998 B2 | 1/2014 | Graumann |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,892,976 B2 | 11/2014 | Graumann |
| 8,938,037 B1 | 1/2015 | Fard et al. |
| 8,966,335 B2 | 2/2015 | Lunelli et al. |
| 8,971,112 B2 | 3/2015 | Crippa et al. |
| 8,971,396 B1 | 3/2015 | Bates et al. |
| 8,990,661 B1 | 3/2015 | Micheloni et al. |
| 9,009,565 B1 | 4/2015 | Northcott et al. |
| 9,026,867 B1 | 5/2015 | Northcott et al. |
| 9,053,012 B1 | 6/2015 | Northcott et al. |
| 9,081,701 B1 | 7/2015 | Northcott et al. |
| 9,092,353 B1 | 7/2015 | Micheloni et al. |
| 9,128,858 B1 | 9/2015 | Micheloni et al. |
| 9,166,623 B1 | 10/2015 | Bates et al. |
| 9,170,876 B1 | 10/2015 | Bates et al. |
| 9,208,018 B1 | 12/2015 | Northcott et al. |
| 9,235,467 B2 | 1/2016 | Micheloni et al. |
| 9,270,296 B1 * | 2/2016 | Nemati Anaraki ......................... G06F 11/1012 |
| 9,305,661 B2 | 4/2016 | Micheloni et al. |
| 9,325,347 B1 | 4/2016 | Graumann et al. |
| 9,397,701 B1 | 7/2016 | Micheloni et al. |
| 9,417,804 B2 | 8/2016 | Micheloni et al. |
| 9,432,053 B1 | 8/2016 | Graumann et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,467,172 B1 | 10/2016 | Graumann et al. |
| 9,473,175 B1 | 10/2016 | Graumann et al. |
| 9,479,297 B2 | 10/2016 | Graumann |
| 9,564,921 B1 | 2/2017 | Graumann et al. |
| 9,564,922 B1 | 2/2017 | Graumann et al. |
| 9,590,656 B2 | 3/2017 | Micheloni et al. |
| 9,602,133 B1 | 3/2017 | Graumann et al. |
| 9,742,439 B1 | 8/2017 | Graumann |
| 9,747,200 B1 | 8/2017 | Micheloni |
| 9,793,924 B1 | 10/2017 | Graumann et al. |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,230,396 B1 | 3/2019 | Micheloni et al. |
| 10,230,552 B1 | 3/2019 | Graumann |
| 10,236,915 B2 | 3/2019 | Graumann et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,505,707 B2 | 12/2019 | Graumann |
| 2013/0254628 A1 | 9/2013 | Kim et al. |
| 2015/0067446 A1 | 3/2015 | Yen et al. |
| 2017/0288699 A1 * | 10/2017 | Yang ...................... H03M 13/45 |
| 2019/0149168 A1 * | 5/2019 | Chang ................ H03M 13/1108 714/752 |
| 2019/0149169 A1 * | 5/2019 | Chang ................ H03M 13/1108 714/752 |

OTHER PUBLICATIONS

PCT/US20/21289, International Search Report and Written Opinion, European Patent Office, dated Jul. 29, 2020.

* cited by examiner

MEMORY CONTROLLER AND METHOD FOR DECODING MEMORY DEVICES WITH EARLY HARD-DECODE EXIT

BACKGROUND

Memory controllers such as flash memory controllers use error correction coding to achieve an acceptable Uncorrectable Bit Error Rate (UBER). A "FEC block" is a contiguous block of information containing digital user information or "data" and associated parity information used to protect the original data against bit-errors.

Various algorithms for decoding data encoded with error correction codes are known in the art. Hard decoding algorithms require only a single value as input for each bit of the original Forward Error Correction (FEC) block and only a single read of the stored FEC block.

Gross-failures may result when wrong addresses are read or when the data is highly corrupted. In some decoding processes, the number of errors in a first layer of the check node processing are used to identify gross-failures. More particularly, when an extremely high number of errors are observed at the end of the processing of the first layer of the hard-decode algorithm, it is determined that a gross-failure has occurred. When a gross-failure is detected decoding is aborted. When the decode process is aborted, the decode process stops and an error is reported to the host. At this point, an error recovery process such as redundant array of independent disks (RAID) may be used to try to recover the stored data.

As flash memory devices age Raw Bit Error Rate (RBER) increases. When a hard decoding algorithm is being used for decoding, at some point the RBER increases to such an extent that the decoder becomes the bottleneck in the system, reducing output rate of the system. More particularly, the time and the number of operations required for the hard-decoding process to reach a maximum number of iterations and fail, the time required for re-reading the data and performing soft-decoding becomes so significant that the throughput of the flash controller decreases. While this has been described in relation to flash memory devices and flash memory controller, this issue is relevant to any memory system which exhibits increasing RBER.

Accordingly, there is a need for a method and apparatus that will allow for decoding that will reduce the negative effects resulting from increased RBER, so as to prevent or delay the occurrence of decreased throughput resulting from hard-decode failures.

BRIEF DESCRIPTION

A method for decoding is disclosed that includes receiving a first Forward Error Correction (FEC) block of read values at a hard-input decode circuit (where each bit of the first FEC block of read values is representative of a corresponding bit of a stored FEC block); and starting a hard-decode process. The hard-decode process includes variable node processing and check node processing on the first FEC block of read values to identify a number of check node failures. During the hard-decode process, the identified number of check node failures are compared to a decode threshold. When the identified number of check node failures is not greater than the decode threshold the hard-decode process is continued. When the identified number of check node failures is greater than the decode threshold the method further includes: stopping the hard-decode process prior to completion of the hard-decode process; generating output indicating that additional reads are required; receiving at a mapper the first FEC block of read values and one or more additional FEC blocks of read values (where each bit of each of the one or more FEC blocks of read values is representative of a corresponding bit of the stored FEC block); mapping the first FEC block of read values and the additional FEC blocks of read values into soft-input values; and performing a soft-decode process on the soft-input values to identify the decoded FEC block.

A memory controller is disclosed that includes an input and output circuit; an encoder configured to encode data received at the input and output circuit into a FEC block; and a write circuit coupled to the encoder. The write circuit is configured for storing the FEC block on memory devices. A read circuit is configured to read the stored FEC block. A hard-input decode circuit is configured to receive a first FEC block of read values (where each bit of the first FEC block of read values is representative of a corresponding bit of the stored FEC block) and to start a hard-decode process. The hard-decode process includes variable node processing and check node processing on the first FEC block of read values to identify a number of check node failures. A decode controller is coupled to the hard-input decode circuit and is configured to compare the identified number of check node failures to a decode threshold during the hard-decode process. When the identified number of check node failures is greater than the decode threshold the decode controller is operable to generate an output indicating that the hard-input decode circuit is to stop the processing of the error correction code and to generate an output indicating that additional reads are required. The hard-input decode circuit is operable, responsive to the output indicating that the hard-input decode circuit is to stop the processing of the error correction code, to stop the hard-decode process prior to completion of the hard-decode process. The memory controller further includes a mapper configured to receive the first FEC block of read values and additional FEC blocks of read values (responsive to the generated output indicating that additional reads are required) and map the first FEC block of read values and the additional FEC blocks of read values into soft-input values. A soft-input decode circuit is coupled to the mapper and is configured to perform a soft-decode process on the soft-input values to identify the decoded FEC block.

A decoder is disclosed that includes a hard-input decode circuit configured to receive a first FEC block of read values (where each bit of the first FEC block of read values is representative of a corresponding bit of a stored FEC block) and start a hard-decode process. The hard-decode process includes variable node processing and check node processing on the first FEC block of read values to identify a number of check node failures. A decode controller is coupled to the hard-input decode circuit and is configured to compare the identified number of check node failures to a decode threshold during the hard-decode process. When the identified number of check node failures is greater than the decode threshold, the decode controller is operable to generate output indicating that the hard-input decode circuit is to stop the processing of the error correction code and generate an output indicating that additional reads are required. The hard-input decode circuit is operable (responsive to the output indicating that the hard-input decode circuit is to stop the processing of the error correction code) to stop the hard-decode process prior to completion of the hard-decode process. The decoder further includes a mapper configured to receive the first FEC block of read values and additional FEC blocks of read values (responsive to the generated output indicating that additional reads are required) and map the first FEC block of read values and the additional FEC blocks of read values into soft-input values. A soft-input decode circuit is coupled to the mapper and is configured to perform a soft-decode process on the soft-input values to identify the decoded FEC block.

Thereby, the method and apparatus of the present invention provides an early hard-decode exit that moves processing out of the hard-input decode circuit prior to completion of the hard-decode process, freeing up the hard-input decode circuits for performing decode operations on other FEC blocks. The workload for decoding is thereby shifted over to the soft-input decode circuits, allowing for the workload to be balanced based on the number of check node failures. Thereby, the utilization of the soft-input decoder is increased as RBER increases. Accordingly, the method and apparatus of the present invention reduces the negative effects resulting from increased RBER, delaying the occurrence of decreased throughput that results from hard-decode failures.

BRIEF DESCRIPTION OF THE DRAWING FIGURES

The invention will be explained in more detail in the following with reference to examples and to the drawings in which are shown.

DETAILED DESCRIPTION

Persons of ordinary skill in the art will realize that the following description is illustrative only and not in any way limiting. Other examples will readily suggest themselves to such skilled persons.

Figure 1:
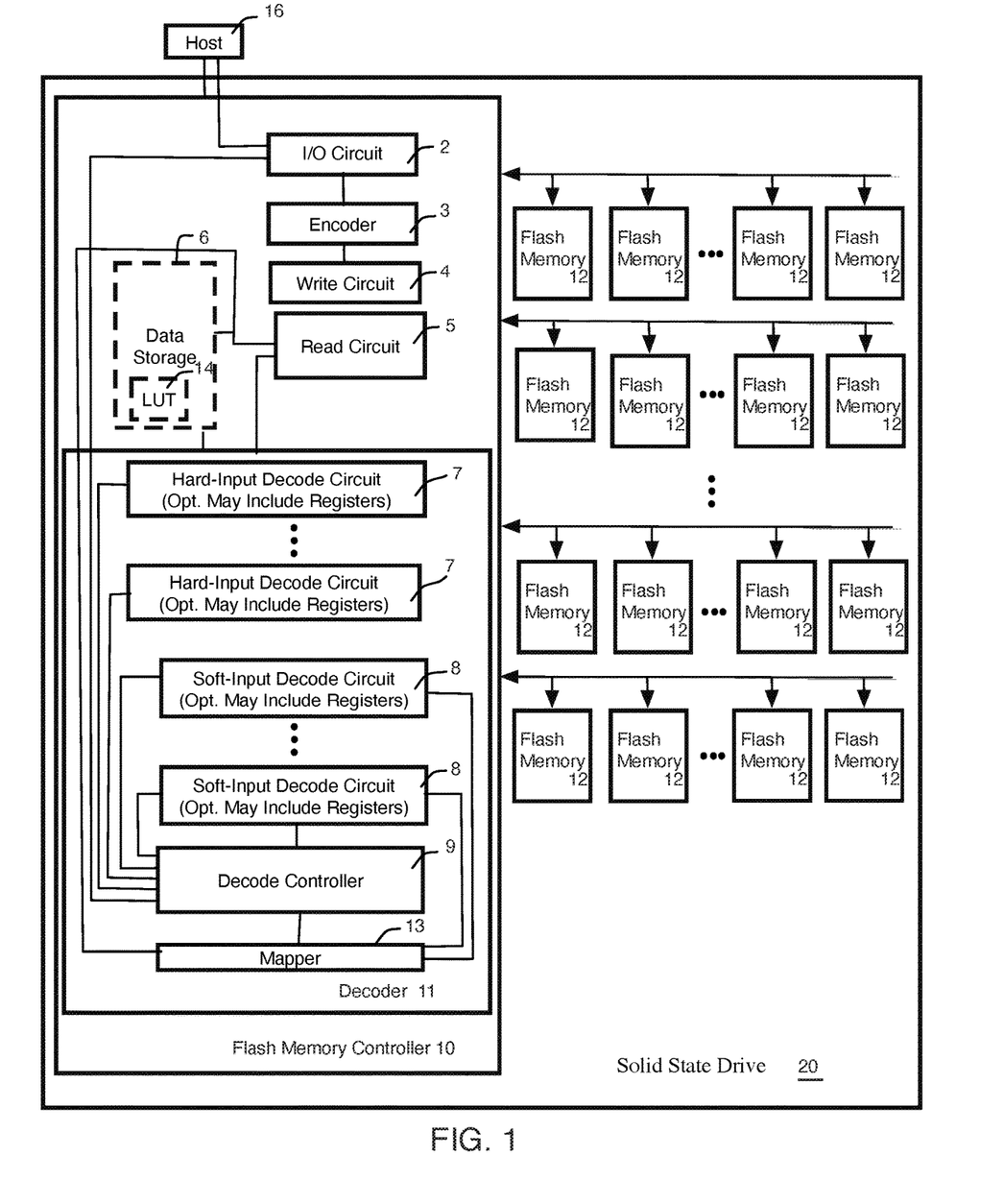
FIG. 1 is a block diagram showing a solid state drive (SSD) that is coupled to a host device in accordance with an example of the invention.

FIG. 1 shows a Solid State Drive (SSD) 20 that includes a flash memory controller 10 and flash memory devices 12. Flash memory controller 10 includes an input and output (I/O) circuit 2 that is coupled to an encoder 3. Encoder 3 is coupled to write circuit 4. Decoder 11 is coupled to data storage 6 and read circuit 5. Decoder 11 includes hard-input decode circuits 7, soft-input decode circuits 8, decode controller 9 and mapper 13. Decode controller 9 is coupled to each of the hard-input decode circuits 7, to each of the soft-input decode circuits 8, to I/O circuit 2 and to mapper 13. Mapper 13 is further coupled to read circuit 5, data storage 6, each of the soft-input decode circuits 8, and registers of decoder 11 in which soft-read values are stored.

When a write instruction with associated data to be written is received from a host device 16 at I/O circuit 2, encoder 3 encodes the received associated data into FEC blocks using an error correction code having a code rate. Code rate (CR)=data(data+parity), where data is the amount of user data in bits within a FEC block and parity is amount parity bits added to a FEC block.

Write circuit 4 is configured for storing FEC blocks received from encoder 3 on flash memory devices 12. Flash memory devices 12 may be any type of nonvolatile memory device. In the present example flash memory devices 12 are NAND devices (e.g. Single-Level Cell (SLC), Multi-Level Cell (MLC), Triple-Level Cell (TLC), Quad-Level Cell (QLC) or higher technologies. However, alternatively flash memory devices 12 could be NOR devices. Read circuit 5 performs read operations on flash memory devices 12, responsive to a read command received from host 16, by sending commands to flash memory devices 12 indicating the type of read to be performed and the address of the information to be read and receives the read results. Read circuit 5 sends the results from the read operation to decoder 11. The read results may be stored in registers within decoder 11 (e.g. registers in one or more hard-input decode circuit 7) or in data storage 6.

A single read of a stored FEC block, typically referred to as a "hard read," produces results that are generally referred to as "hard-read values" (e.g., the results from a conventional "READ" instruction) and the results may be stored in the form of an FEC block in a respective register of decoder 11, with a single bit of the hard-read values (e.g., a "0" or a "1") representative of a corresponding bit of the stored FEC block.

Hard-input decode circuits 7 are configured to perform processing of an error correction code algorithm on the hard-read values and soft-input decode circuits 8 are configured to perform processing of the error correction code algorithm on soft-input values, as will be described further below.

When the processing of an iteration by hard-input decode circuits 7 or soft-input decode circuit 8 is successful (i.e. in the absence of any check node failures), decode controller 9 is configured to identify the stored FEC block, remove the parity bits to obtain the originally stored data and send the originally stored data to I/O circuit 2 for output to host device 16.

A check node is a processing element that verifies the parity state over a number of binary input values. A correct node would report that the parity of the input values has even parity while an incorrect node would report odd parity. An error correction code such as, for example, an low-density parity-check (LDPC) error correction code, is made up of a plurality of check nodes and the decode process operates to force all check nodes to an even state. Thus, the number of failing (odd parity) check nodes within an LDPC decoder is indicative of the number of error bits that must be corrected.

Figure 5:
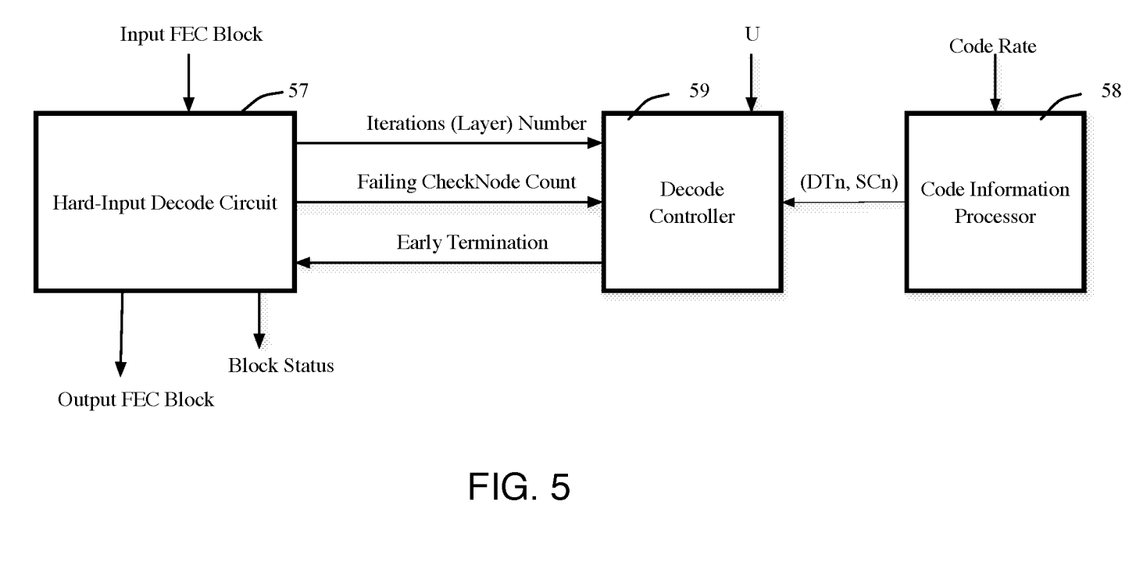
FIG. 5 is a diagram showing an exemplary hard-input decode circuit, a decode controller, and a code information processor in accordance with an example of the invention.

In one example, each hard-input decode circuit 7 is coupled to decode controller 9 in the manner as shown in FIG. 5, and includes: a first input coupled to receive FEC blocks of read values; a second input coupled to decode controller 9 for receiving an Early Termination Signal; a first output coupled to a corresponding input of decode controller 9 for outputting an Iteration (layer) Number Signal that indicates the number of iterations and/or the number of layers processed in the current hard-decode process; and a second output for outputting a Failing CheckNode Count signal that indicates the number of check node failures in the decode operation.

Mapper 13 includes circuits and processing logic configured to transport the data from read circuit 5 to registers within decoder 11 (e.g., registers in one or more soft-input decode circuits 8) while transforming the data into the format required by soft-input decode circuits 8. Soft-input decode circuits 8 are each configured to perform a soft-decode process on the soft-input values to identify the decoded FEC block.

In some examples hard-input decode circuits 7 are identical to soft-input decode circuits 8, with the only difference being the type of input fed into the decode circuit. In other examples soft-input decode circuits 8 perform calculations using a higher number of significant figures than the calculations performed by hard-input decode circuits 7. In another embodiment hard-input decode circuits 7 perform calculations based on Log-Likelihood Ratio (LLR) values and, prior to the processing of the first layer or iteration of the error correction code, each of the hard-read values is assigned a value of either a −8 (e.g. for a bit value of "1") or a +8 (e.g. for a bit value of "0").

Figure 2:
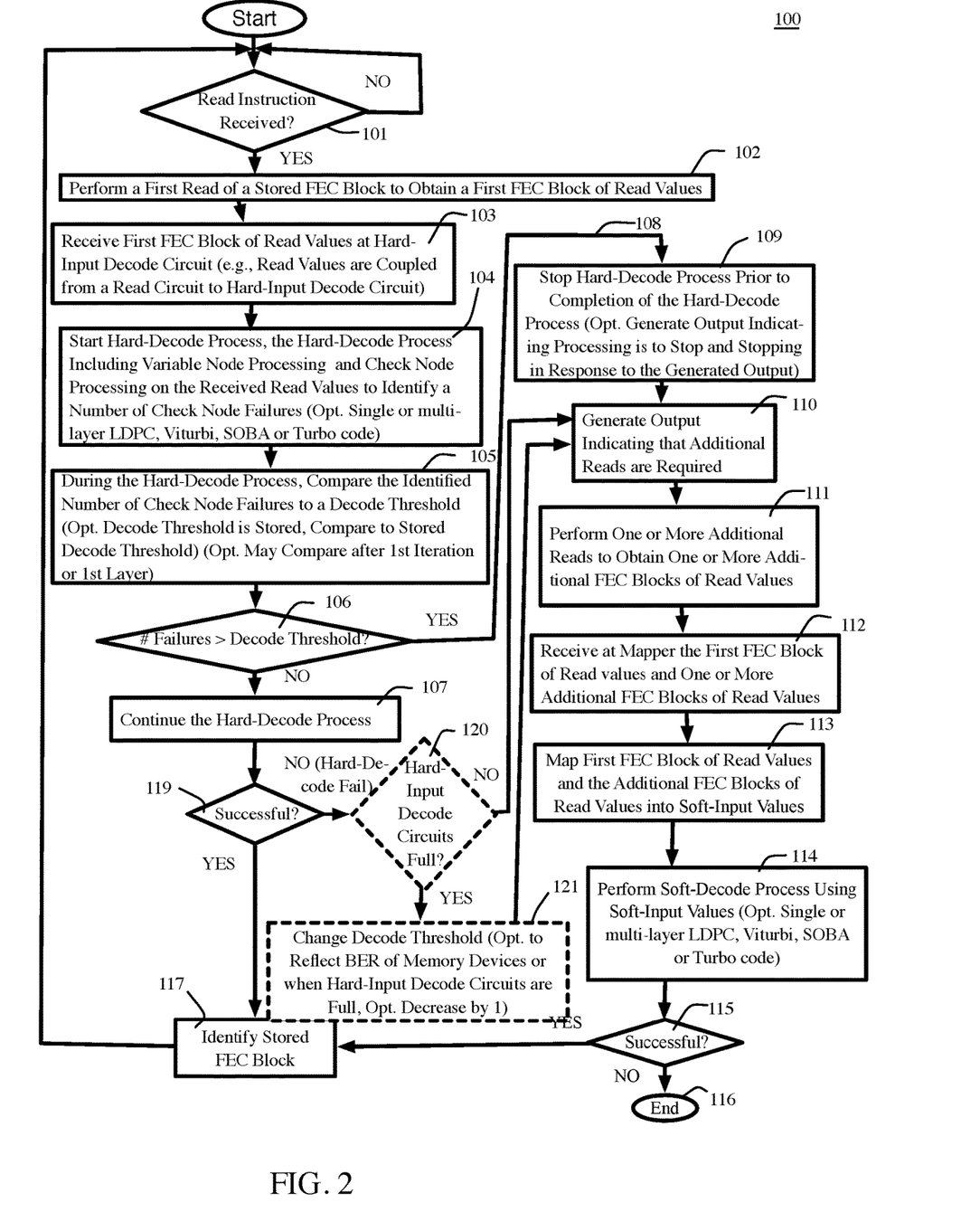
FIG. 2 illustrates a method for decoding a FEC block in accordance with an example of the invention.

FIG. 2 illustrates a method 100 for decoding a FEC block in accordance with an example of the present invention. Method 100 may be performed by the apparatus of FIG. 1. When a read instruction is received (101) a first read of an FEC block stored in memory, such as on a flash memory device 12 of SSD 20, is performed (102). A first Forward Error Correction (FEC) block of read values is received (103) at a hard-input decode circuit, where each bit of the first FEC block of read values is representative of a corresponding bit of the stored FEC block.

A hard-decode process is started (104), the hard-decode process including variable node processing and check node processing on the first FEC block of read values to identify a number of check node failures. In one example of the present invention each hard-input decode circuit 7 is configured for receiving an FEC block of read values, (where each bit of the first FEC block of read values is representative of a corresponding bit of a stored FEC block) and starting a hard-decode process, the hard-decode process including variable node processing and check node processing on the first FEC block of read values to identify a number of check node failures.

During the hard-decode process, the identified number of check node failures is compared (105) to a decode threshold. In one example hard-input decode circuit 7 includes a register that indicates the cumulative number of errors in the decode process and hard-input decode circuit 7 may output a Failing CheckNode Count signal, as described above in relation to FIG. 5, indicating the cumulative number of errors. Decode-controller 9 is configured for comparing the identified number of check node failures to a decode threshold during the hard-decode process.

In an example in which the error correction code is a single-layer error-correction code, decode controller 9 is configured to compare (105) the identified number of check node failures in a first iteration of the single-layer error correction code to the decode threshold and is configured to generate an output indicating that the hard-input decode circuit is to stop the processing of the error correction code when the identified number of check node failures in the first iteration of the error correction code is greater than the decode threshold.

In an example in which the error correction code is a multi-layer code, decode controller 9 is configured to compare (105) the identified number of check node failures in a first iteration (e.g. the cumulative number of errors in all of the layers of the first iteration) of a multi-layer error correction code to the decode threshold and is configured to generate output indicating that the hard-input decode circuit is to stop the processing of the error correction code when the identified number of check node failures in the first iteration of the multi-layer error correction code is greater than the decode threshold.

In another example in which the error correction code is a multi-layer code, the decode controller 9 is configured to compare (105) the identified number of check node failures in a first layer of a first iteration to the decode threshold and is configured to generate output indicating that the hard-input decode circuit is to stop the processing of the error correction code when the identified number of check node failures in the first layer of the first iteration of the error correction code is greater than the decode threshold. Alternatively, layers of subsequent iterations, or all layers of a particular subsequent iteration may be compared in step 105.

When the identified number of check node failures is not greater than the decode threshold (106, 107) the hard-decode process is continued (107). The hard-decode process continues until it is successful (119, 117) or until it fails. The process typically fails when a maximum number of iterations is reached and the stored FEC block has not yet been identified. When the hard-decode process fails, soft information is obtained and decoding is performed using the soft information (110-115) as is described in more detail below.

The decode threshold may be changed (120) at various times. In one example, the decode threshold is changed by storing a set of predetermined decode threshold values for various points in the life span of flash memory devices 12 and selecting the predetermined decode threshold value that corresponds with the current point in the life span of flash memory devices 12. For example, exemplary flash memory devices (e.g., NAND devices having the same design, manufacture, etc.) could be modeled to obtain a set of predetermined decode thresholds values. The predetermined decode threshold values can be stored in a lookup table (LUT) 14 of data storage 6 that is accessed to identify a predetermined decode threshold value corresponding to the type of flash memory device 12 being used and the current point in the lifespan of the flash memory device 12 (e.g., at a certain number of program/erase cycles is used). In one example, firmware of flash memory controller 10 (not shown) tracks the number of program and erase cycles.

Optionally, the decode threshold is changed (120) when the hard-input decode circuits 7 are determined to be full (120, 121). Decode controller 9 is configured to monitor the operations of hard-input decode circuits 7 for determining when the hard-input decode circuits 7 are full. In one example, the decode threshold starts at a sufficiently high rate that no hard-decode processes are being stopped (steps 106, 108 of FIG. 2), and each time that hard-input decode circuits 7 are determined to be full, decode controller 11 reduces the decode threshold (e.g., an incremental decrease that may be, for example a decrease by an increment of 1).

When the identified number of check node failures is greater than the decode threshold (106) the hard-decode process is stopped prior to completion (108) (e.g., prior to reaching a maximum number of iterations or successfully identifying the stored FEC block) and soft information is used (steps 110-115) to identify the stored FEC block (117). Decode-controller 9 is configured for generating output indicating that the hard-input decode circuit is to stop the processing of the error correction code when the identified number of check node failures is greater than the decode threshold. In response, the respective hard-input decode circuit 7 stops the hard-decode process prior to completion of the hard-decode process, and no subsequent iterations of the error correction code are performed.

In one example, decode controller 9 is configured for sending an Early Termination Signal to hard-input decode circuit 7, as illustrated in FIG. 5. In response to receiving the Early Termination signal, hard input decode circuit 7 is configured to stop the hard-decode process, either immediately or after completion of the layer or iteration being processed.

When the identified number of check node failures is greater than the decode threshold an output is generated (110) indicating that additional reads are required. Decode-controller 9 is configured to generate output (e.g., one or more signals to read circuit 5) indicating that additional reads are required when the identified number of check node failures is greater than the decode threshold.

In response to the output indicating that additional reads are required, one or more additional reads are performed (111) to obtain one or more additional FEC blocks of read values. The additional reads of step 111 are reads of locations within a flash memory device 12 that are related to the memory cells in which the FEC block is stored. Reads in which more information is obtained relating to values that have previously been read are generally referred to as "soft reads" and the obtained information obtained from such reads is referred to as "soft-read values" and sometimes as "soft information." Accordingly, the additional reads of step 111 are "soft reads" and they produce "soft-read values".

In one example, read circuit 5 is configured to perform additional reads of the same addresses in flash memory devices 12 that were read in step 102 (e.g., using a conventional READ instruction).

In one example a first additional read of the stored FEC block is performed by sending a first threshold voltage shift read command indicating a negative threshold voltage shift to obtain a first additional FEC-block of soft-read values, and a second additional read is performed by sending a second threshold voltage shift read command indicating a positive threshold voltage shift to obtain a second additional FEC block of soft-read values. Also, a REREAD instruction could be used to obtain a soft-read of the stored FEC block. In yet another example the flash memory devices 12 perform two reads of the stored FEC block (Vt+, Vt−) in response to a reread instruction and the results of the two reads are XOR'd together to provide a single set of soft-read values that is output by flash memory devices 12.

In another example, each bit is read 3 times in exactly the same way. A voting scheme would then identify "strong" inputs (all 3 reads agree) and weak inputs where 2 reads are one sign and the third reads is of the opposite sign. The read values and the identifier are output as soft-read values output by flash memory devices 12.

The first FEC block of read values and the one or more additional FEC blocks of read values are received at the mapper 13 (112), where each bit of each of the one or more additional FEC blocks of read values is representative of a corresponding bit of the stored FEC block. The first FEC block of read values (e.g., the hard-read values) and the additional FEC blocks of read values (e.g., the soft-read values) are mapped (113) into soft-input values. Mapper 13 is configured to receive the first FEC block of read values and the additional FEC blocks of read values responsive to the generated output indicating that additional reads are required and configured for mapping the first FEC block of read values and the additional FEC blocks of read values into soft-input values.

In one example, the mapping process combines multiple reads for a given bit of information into a single decoder input value referred to as a "soft-input value". The soft-input value indicates a probability (e.g., the probability of an input signal being a 1 or a 0). In the example shown in FIG. 1, mapper 13 identifies the soft-input value and provides the identified soft input value it to the respective soft-input decoder circuit 8.

Table 1 shows an example of different probability values $P_{n\_m}$ for each read condition, where n is the read condition (in this case the binary value of what is returned from 3 reads) and m is either 0 or 1 representing a real bit as a 0 or a 1, where $P_{n\_0}+P_{n\_1}=1.0$.

TABLE 1

Soft Mapping Table

| Read Soft Bit 1 | Read Soft Bit 2 | Read Soft Bit 3 | Probability of 0 | Probability of 1 | LLR |
|---|---|---|---|---|---|
| 0 | 0 | 0 | P0_0 | P0_1 | LLR_0 |
| 0 | 0 | 1 | P1_0 | P1_1 | LLR_1 |
| 0 | 1 | 0 | P2_0 | P2_1 | LLR_2 |
| 0 | 1 | 1 | P3_0 | P3_1 | LLR_3 |
| 1 | 0 | 0 | P4_0 | P4_1 | LLR_4 |
| 1 | 0 | 1 | P5_0 | P5_1 | LLR_5 |
| 1 | 1 | 0 | P6_0 | P6_1 | LLR_6 |
| 1 | 1 | 1 | P7_0 | P7_1 | LLR_7 |

The probability data (e.g., $P_{n\_m}$) may be gathered during characterization of the device, where a known sequence is written and then read back using 3 reads. These 3 reads are usually slightly different, i.e. a threshold voltage shift of the read voltage for each case. It is appreciated that the characterization process is performed in a test lab using similar devices (e.g., the same type of device, design of device, and possibly the same production run in the fabrication facility) prior to delivery of the device to a customer.

In one example, the identified probability data is used to calculate a single LLR value (Pn) using the equation: $LLR_n = \log(P_{n\_0}/P_{n\_1})$.

In one example, LUT 14 comprises an LLR mapping table that includes one or more values representing the read results (e.g., columns 1-3 of Table 1) and a corresponding probability value (e.g., a LLR value such as a LLR_n value shown in Table 1).

In another example, the soft mapping operation includes identifying a probability value corresponding to the read results by indexing the stored LLR mapping table, using the first FEC block of read values and the additional blocks of read values to identify a corresponding LLR value as a soft-input value.

A soft-decode process is performed (114) on the soft-input values to identify the decoded FEC block. A respective soft-input decode circuit 8 is configured to perform a soft-decode process on the soft-input values to identify the decoded FEC block. The hard-decode process and the soft-decode process may each perform any error correction code that allows for soft data input and processing such as, for example, a Viterbi code, a Soft Output Viterbi Algorithm (SOVA) code, a Turbo code or a Low-Density Parity-Check (LDPC) code.

In the event (115) that soft-decoding process of steps 110-114 fails, further efforts (not shown) may be employed to help recover the FEC block (116). The next steps, may be, for example, to perform additional soft-reads and combine more read information and then repeat the soft-decode process (114) again, to try different mapping on the soft-reads or to go to RAID as a last resort.

The hard-read/hard decode and soft-read/soft-decode process with early hard-decode exit of the present invention moves processing of potentially-difficult-to-decode blocks out of the hard-input decode circuits 7 early in the hard-decode process (before the hard-decode process has reached the maximum number of iterations), thus reducing the number of decode iterations and freeing up the hard-input decode circuits 7 for performing decode operations on other FEC blocks.

Figure 3:
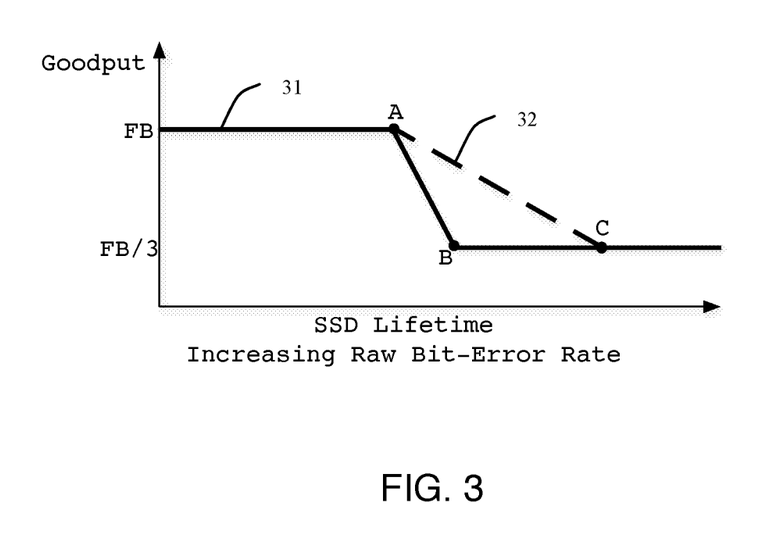
FIG. 3 is a diagram illustrating a goodput profile of a typical prior art SSD and the theoretical maximum goodput improvement achievable by the method and apparatus of the present invention.

Line 31 of FIG. 3 represents the Goodput profile of a SSD drive, where the x-axis represents SSD lifetime, i.e. age of the solid state drive 20 measure in read/write cycles, and the y-axis represents Goodput, with the section of line 31 between A-B and B-C representative of an exemplary prior art SSD drive and the dashed line 32 representative of the method and apparatus of the present invention, where Goodput is the amount of information being read from the drive and passed to the operating system. At the start of life of the solid state drive 20 a maximum of Full Bandwidth (FB) G Bytes/s is obtained, which is the maximum read bandwidth of the flash memory device 12 minus some overhead for error correction code parity information. As the sold state drive ages it eventually reaches point A where the hard decode throughput limit of the hard-input decode circuits 7 is reached. As RBER increases further due to age, the goodput trend of prior art SSD's follows the solid trajectory down from point A to point B where the goodput of the system reaches FB/3 (In this example soft decoding is performed using 3 reads from flash memory devices 12 for each bit of stored information). Beginning at B the hard-decode engines of a prior art SSD are fully occupied and the bandwidth read at the flash is also at FB/3. The excess available 2FB/3 bandwidth (BW) of the SSD is no longer available to the exemplary prior art system. At some point after point B, for a prior art SSD to maintain throughput at FB/3 requires all soft-decoding. Point C represents an exemplary point at which only soft-decoding is used and hard-input decoding stops in the present embodiments.

The dashed line 32 that extends from A to C is target goodput for the method and apparatus of the present invention that can theoretically be obtained by adjusting the decode threshold of method 100 to balance the number of hard and soft decode operations so that maximum Goodput is obtained at each bit-error rate encountered during the life of the SSD 20. The vertical distance between dashed line 32 and solid line 31 represents the theoretical maximum improved goodput of the method and apparatus of the present invention as compared to a conventional prior art SSD.

In one example of the present invention, at the beginning of life of SSD 20, the decode threshold is set to a high value so that all decodes are performed using standard hard-input decoding (e.g., represented by line 31 from beginning of life to point A). As the input BER increases the throughput of the hard decode engines continues to decrease, at some point the hard decode throughput is insufficient to completely use all the available read bandwidth from the flash memory, resulting in a drop in utilization of flash BW. Also at this time decoder 11 issues a hard-decoder-full signal indicating that the hard decoders have become the throughput bottleneck of the system (blocks are ready to decode but cannot be processed) and the full available read flash BW from the memory is not being utilized. When this happens the decode threshold is decreased by one so that more difficult FEC blocks will abandoned early and will be decoded using the soft-decode process 114 (maintaining the goodput as close as possible to line 32). This process continues until the decode threshold reaches a minimum value (e.g., the horizontal line between point B, point C and extending beyond C). As the decode threshold is decreased more flash BW is used, increasing Goodput as compared to prior art SSD's until point C is reached, which represents the point at which the method and apparatus of the present invention moves to all-soft decoding (because there is no point in continuing to do hard-decode processing and comparison of steps 101-107 of FIG. 1 since all blocks to be decoded will have sufficiently high RBER that they will need the soft-decode of steps 110-115 (FIG. 1) and efficiency is obtained by just doing soft-decode processing (steps 110-115).

Figure 4:
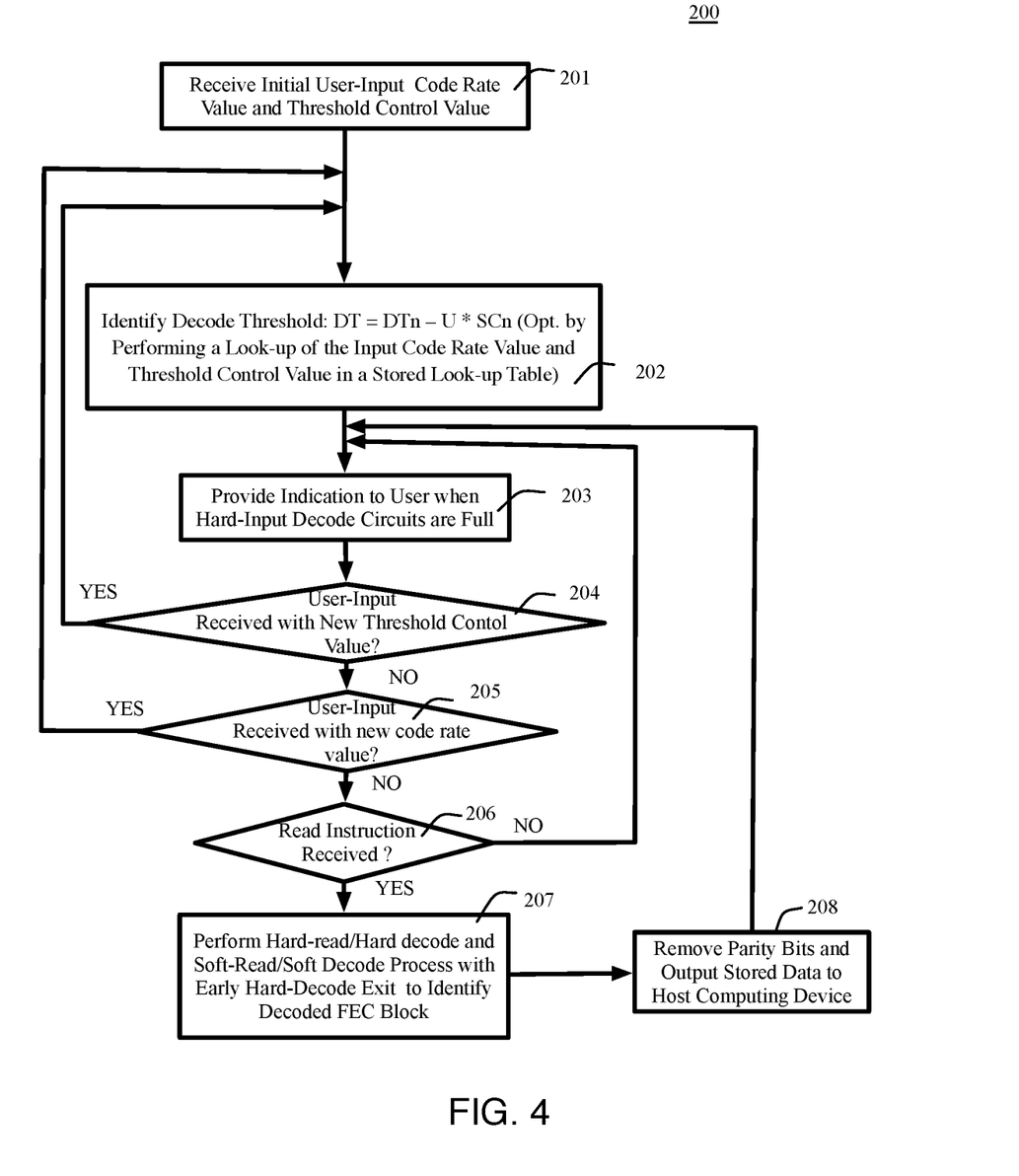
FIG. 4 is a diagram illustrating a method in which user input is received for controlling code rate and decode threshold in accordance with an example of the invention.

FIG. 4 illustrates a method (200) where an initial user-input code rate value and an initial threshold control value are received (201). A decode threshold is identified (202) using the code rate value and threshold control values received in step (201) (or using default values). In one example simulations are run on a large number of flash memory devices using different code rate values to obtain a decode threshold base value (DTn) and scaling value (SCn) for each code rate. The decode threshold base values are selected so that they provide similar results (e.g., approximately the same number of decode operations being transferred over to the soft decoder) at each code rate. In the present example the scaling value for each code rate is different, with the scaling value for each code rate determined during the simulation process so that at each code rate value selected by the user, the amount of change resulting from decreases in the threshold control values is similar. In one exemplary example the user is able to select a threshold control value (U) from one to ten and the corresponding decode threshold (DT) is calculated using the equation: $DT=DTn-U*SCn$.

FIG. 5 shows a portion of an exemplary decoder that includes hard-input decode circuit 57, a decode controller 59 and code information processor 58. Decode controller 59 is coupled to code information processor 58 and to hard-input decode circuit 57. Code information processor 58 includes logic and/or dedicated circuitry for converting an input code rate into DTn and SCn. In one embodiment code information processor 58 is operable to receive the user-input code rate of step 201 and output DTn and SCn for the received code rate. Decode controller 59 is operable for receiving the input U, DTn and SCn and identifying the corresponding decode threshold of step 202.

Hard-input decode circuit 57 includes a first input coupled to receive FEC blocks of read values and a second input coupled to decode controller 59 for receiving an Early Termination Signal from decode controller 59. Hard-input decode circuit 57 also outputs a block status signal (e.g., decode failure or success, number of iterations required and correction statistics (the corrected zeroes and corrected ones for the FEC block)). Hard-input decode circuit 57 includes a first output coupled to a corresponding input of decode controller 59 for outputting an Iteration (Layer) Number signal that indicates the number of iterations and/or the number of layers processed in the current hard-decode process. A second output is coupled to a corresponding input of decode controller 59 for outputting a Failing CheckNode Count signal that indicates the cumulative number of check node failures in the decode operation.

Referring now to FIG. 4, an indication to a user is provided when all hard-input decode circuits 7 are full (203). The user, who in this case may be the purchaser of the flash memory controller 10, may design their own SSD that includes flash memory controller 10, flash memory 12 and circuits and/or logic for controlling the operation of the SSD.

In one example, based on incoming decode requests and block status signals from hard-input decode circuits 7, decode controller 9 is operable to identify when the hard-input decoding circuits 7 are full (e.g., when it is at full capacity and cannot process additional hard-input FEC blocks). When the hard-input decoding capacity of the decoder is determined to be full (e.g., when all hard-input decode circuits 7 are busy) the decode controller 9 is operable to generate an output to I/O circuit 2 indicating that hard-input decode circuits are full (e.g. a hard-decoder-full signal). The I/O circuit 2 then generates a corresponding output to host computer 16 indicating that that the hard-input decode circuits are full. In one example, when a request for decoding a new FEC block of hard-read values is received and decode controller 9 determines that all hard-input decode circuits 7 are busy, it is operable to generate the hard-decoder-full signal.

In the event that new user input is received that includes a new threshold control value (204) the decode threshold is updated (202) by identifying a decode threshold that corresponds to the new threshold control value. In one example the user is allowed to select from over 100 different code rates. Each time a new code rate value is received (205) the decode threshold is updated (202). The new decode threshold is then stored in one or more of data storage 6, in registers in decoder 11 and in hard-input decode circuit 57.

In one example, at the beginning of life the decode thresholds is set to a high value so that all decodes are performed using the hard-input decoding process. The user monitors the memory device goodput, and when the goodput drops below FB, i.e. below the full bandwidth, then the U is increased by one setting. There is no requirement that the increase be by a one setting, and in some embodiments the increase may be by more than one, without exceeding the scope of the present invention. This will lower the decode threshold so that difficult FEC blocks will be abandoned early and would then be decoded using the soft-input decoding process.

When a read instruction is received (206) from host device 16, the hard-read/hard decode and soft-read/soft-decode process with early hard-decode exit of method 100 is performed (207), as described above in relation to method 100, to identify the decoded FEC block. Once the decoded FEC block is identified (207), parity bits are removed from the decoded FEC block to obtain the originally stored data (208), which is then sent to input and output circuit 2, that is operable to output the originally stored data to the host device 16.

Method 200 allows the user to use the indication that all hard-input decode circuits 7 are full (203), along with other information that may be obtained by the user regarding performance, to balance the operations between soft-input decoding and hard-input decoding. The user may also allow a default automated control function of the decoder to control the selection of the threshold control value (in which case the threshold control value is initially set to a high value and is decreased each time all hard-input decode circuits 7 are full), as described in method 100 in relation to steps 120, 121.

Figure 6:
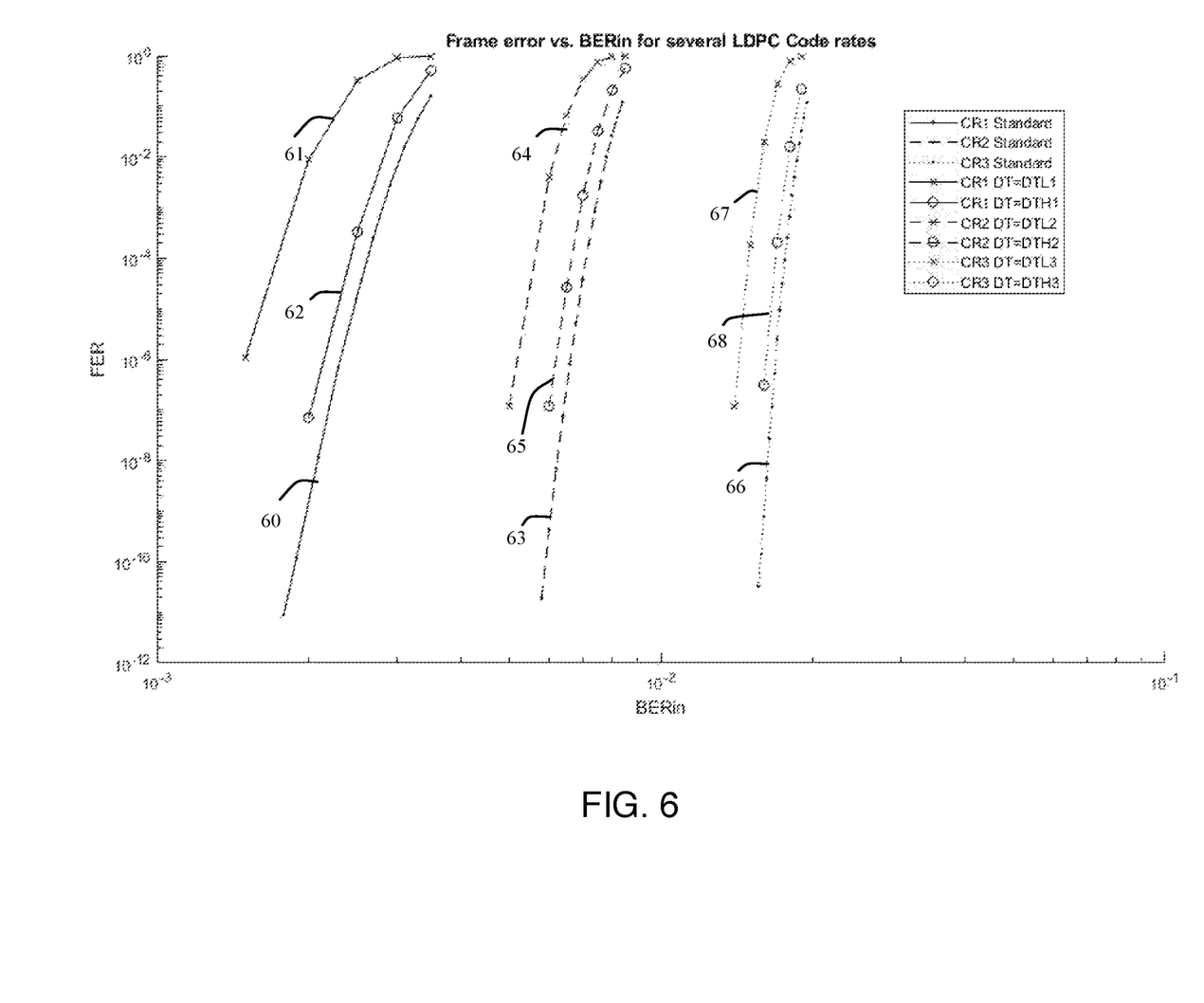
FIG. 6 is a graph showing frame error rate on the vertical axis and bit error rate of the frames received at the decoder (BERin) on the horizontal axis, that illustrates performance of an exemplary SSD in accordance with an example of the invention.

FIG. 6 shows frame error rate (FER) vs the BER of an exemplary frame received at the decoder (BERin) for an error correction code at three different code rates, CR1, CR2 and CR3, where CR1>CR2>CR3. In this example, curves 60-62 illustrate performance at CR1, curves 63-65 illustrate performance at CR2 and curves 66-68 illustrate performance at CR3. In this example, CR1, CR2 and CR3 are n-row LDPC error correction codes, where the number of rows in CR1 is less than the number of rows in CR2, and the number of rows in code CR2 is less than the number of rows in CR3. The results at each of the indicated code rates are shown for a prior art case (equivalent to a decode threshold set so high that there is no early-exit, shown as "standard"), an exemplary "low decode threshold" and an exemplary "high decode threshold," shown in the form DTnm where n is either L for "Low" or H for "High" and n is the code rate number between 1 and 3. More particularly, curves 60, 63 and 66 illustrate the case where the decode threshold is set so high that there are no early decode exits (DT=very high), curves 62, 65 and 68 show FER at a high decode threshold and curves 61, 64 and 67 show FER at a low decode threshold (where $DT_{veryhigh} > DT_{high} > DT_{low}$.

A prior-art decode operation has the best 1-BR performance since each early-exit of the present invention is seen as a frame error. A high value for the decode threshold means that most FEC blocks will be permitted to continue hard-decoding since the number of failing check nodes will tend to fall below the high decode threshold value. As decode threshold (DT) decreases we begin to degrade the FER curve performance. The purpose for doing this is to improve SSD read performance by selectively discarding difficult hard-decode FEC blocks and converting them to soft-decode FEC blocks so that they can easily be decoded.

In one example, threshold control value U is a 4-bit value starting from zero that slowly moves the frame error rate vs BER for CR1 in FIG. 6 from the location of curve 60 towards the location of curve 62 and then to the location of curve 61 at the highest settings as U is increased. Similarly, for CR2, increasing U slowly moves the frame error rate vs BER from the location of curve 63 towards the location of curve 65 and then to the location of curve 64. Moreover, for CR3, changing U slowly moves the frame error rate vs BER from the location of curve 66 towards the location of curve 68 and then to the location of curve 67.

Figure 7:
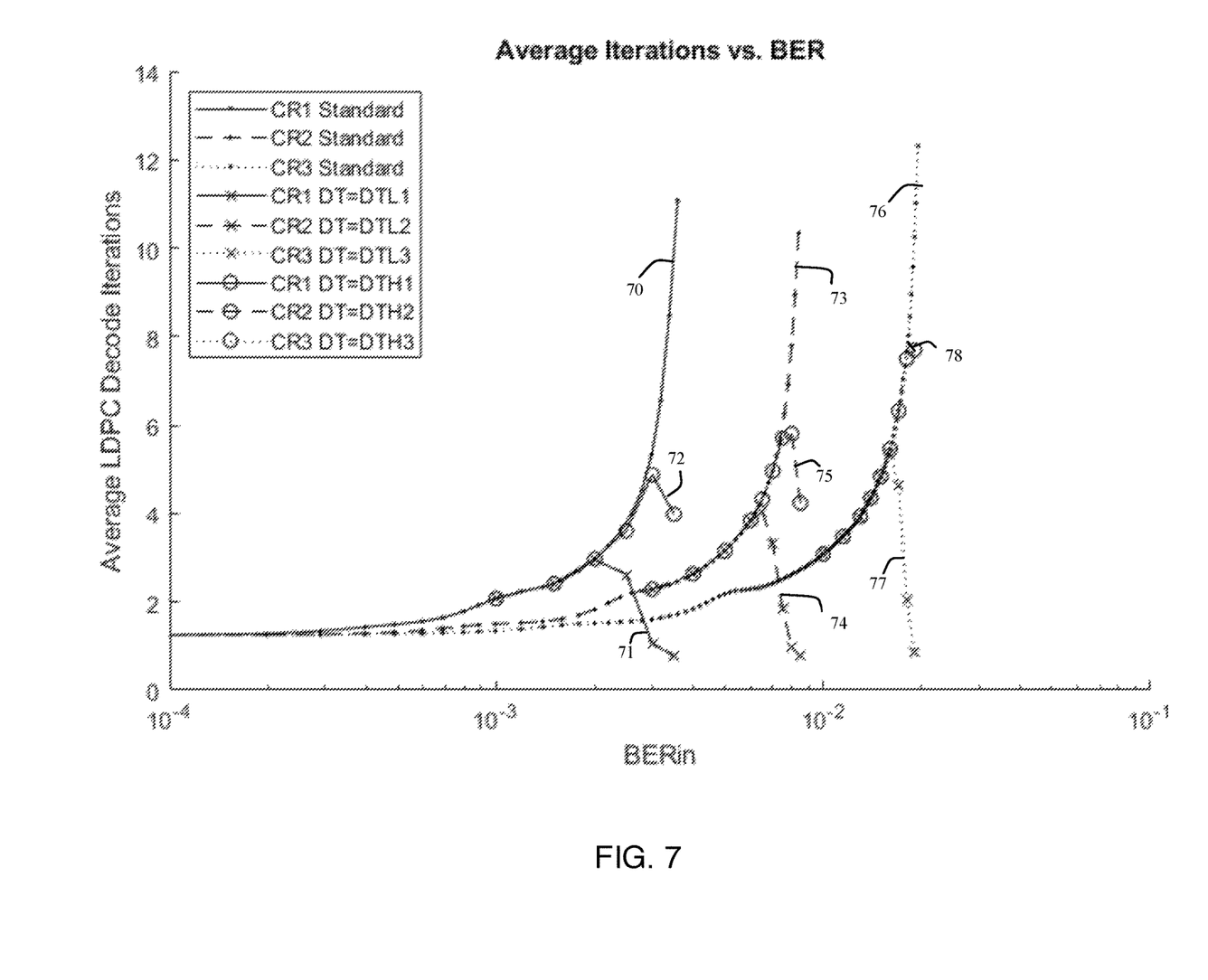
FIG. 7 is a graph showing average iterations on the vertical axis and bit error rate of the frames received at the decoder (BERin) on the horizontal axis, that illustrates performance of an exemplary SSD in accordance with an example of the invention.

FIG. 7 illustrates average iterations vs. BERin for the codes and code rates shown in FIG. 6. More particularly, curves 70, 73 and 76 illustrate the case where the decode threshold is set so high that there are no early decode exits (equivalent to prior-art systems), curves 72, 75 and 78 show FER at a high decode threshold and curves 71, 74 and 77 show FER at a low decode threshold. At the early stages in the lifespan of the flash memory devices 12 a low BERin is achieved, with the BERin increasing as the flash memory devices 12 age. Initially, the hard-decode process (104) is successful in decoding all incoming frames without taking an excessive amount of decode iterations. However, without early hard-decode exit, as is illustrated by curves 70, 73, 76, as BERin increases (e.g., as flash memory devices 12 age) more and more hard-decode processes fail, significantly increasing the total number of decode iterations. Curves 72, 75 and 78 show how the methods and apparatus of the present invention decreases the number of iterations at a high decode threshold. Curves 71, 74 and 77 show how the methods and apparatus of the present invention decreases the number of iterations at a low decode threshold (e.g., less iterations of hard decoding, resulting in less overall iterations).

The number of check nodes in any H-matrix and code rate is dependent on a number of factors including but not limited to code rate, FEC block size and the H-Matrix for the block. In the example shown in FIGS. 6-7, CR1=0.95, CR2=0.9 and CR3=0.8. Code CR1 has the fewest number of check equations in the code and the low decode threshold (DTL1) is 16% of the total number of check nodes while the high decode threshold (DTH1) is 20% of the check nodes and the very high decode-threshold (DTstandard) is set at 100% of the check nodes being used at CR1. For CR2 DTL2 is 19% of the check nodes in the code; the high decode threshold (DTH2) is 23% of the check nodes in the code; and the very high decode-threshold (DTstandard) is 100% of the check nodes in the code For CR3 DTL3 is 23% of the check nodes in the code; the high decode threshold (DTH3) is 27% of the check nodes in the code; and the very high decode-threshold (DTstandard) is 100% of the check nodes in the code.

In one example, to compute the physical threshold values we can multiply the recommended percentage by the number of check nodes in the H-Matrix. For example, for CR1 we may have 2048 check nodes in the H-Matrix and for DTL1 we have a threshold of 16% so DT1=2048*0.16=327.

In one example, flash memory controller 10 is implemented in an integrated circuit as a single semiconductor die. Alternatively, the integrated circuit may include multiple semiconductor die that are electrically coupled together such as, for example, a multi-chip module that is packaged in a single integrated circuit package.

In various examples, portions of decoder 11 and/or flash memory controller 10 may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, a network processor, a microcontroller or general-purpose computer.

While examples and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for decoding comprising:
receiving a first Forward Error Correction (FEC) block of read values at a hard-input decode circuit, each bit of the first FEC block of read values representative of a corresponding bit of a stored FEC block;
starting a hard-decode process by the hard-input decode circuit, the hard-decode process including variable node processing and check node processing on the first FEC block of read values to identify a number of check node failures;
during the hard-decode process, comparing the identified number of check node failures to a decode threshold;
when the identified number of check node failures is not greater than the decode threshold, continuing the hard-decode process by the hard-input decode circuit;
when the identified number of check node failures is greater than the decode threshold:
stopping the hard-decode process prior to completion of the hard-decode process;
generating output indicating that additional reads are required;
receiving at a mapper the first FEC block of read values and one or more additional FEC blocks of read values, each bit of each of the one or more additional FEC blocks of read values representative of a corresponding bit of the stored FEC block;
mapping the first FEC block of read values and the one or more additional FEC blocks of read values into soft-input values; and
performing a soft-decode process on the soft-input values to identify the decoded FEC block.

2. The method of claim 1 wherein the comparing the identified number of check node failures to a decode threshold comprises comparing the number of check node failures in a first iteration of a single-layer error correction code to the decode threshold, the stopping the hard-decode process comprising not performing any subsequent iterations of the single-layer error correction code on the first FEC block of read values.

3. The method of claim 1 wherein the hard-decode process and the soft-decode process comprise performing a multi-layer Low-Density Parity-Check (LDPC) error correction code.

4. The method of claim 1 wherein the hard-decode process and the soft-decode process comprise performing an error correction code selected from the group consisting of a Viterbi code, a Soft Output Viterbi Algorithm (SOVA) code and a Turbo code.

5. The method of claim 1 wherein the comparing the identified number of check node failures to a decode threshold further comprises comparing the number of failures in a first layer of a first iteration of a multi-layer error correction code to the decode threshold, and wherein stopping the hard-decode process comprises not performing any subsequent iterations of the multi-layer error correction code on the first FEC block of read values.

6. The method of claim 1 further comprising:
performing a first read of the stored FEC block by sending a read command from a read circuit of a flash memory controller to one or more flash memory devices on which the FEC block has been stored, and receiving at the read circuit, in response to the sending a read command, the first FEC block of read values;
coupling the first FEC block of read values to the hard-input decode circuit; and
in response to the generated output indicating that additional reads are required, performing one or more additional reads by sending one or more additional read commands from the read circuit of the flash memory controller to the one or more flash memory devices on which the FEC block has been stored, and receiving, in response to the sending one or more additional read commands, the one or more additional FEC blocks of read values.

7. The method of claim 1 wherein the continuing the hard-decode process further comprises continuing the hard-decode process until the hard-decode process has either successfully identified the stored FEC block or has failed, and the stopping the hard-decode process prior to completion of the hard-decode process further comprises stopping the hard-decode process before the hard decode process has either successfully identified the stored FEC block or has failed.

8. The method of claim 1 further comprising changing the decode threshold during the life of the nonvolatile memory devices to reflect the Bit Error Rate (BER) of the flash memory devices.

9. The method of claim 1 further comprising changing the decode threshold when the hard-input decode circuit is full.

10. The method of claim 1 further comprising incrementally decreasing the decode threshold when the hard-input decode circuit is full.

11. The method of claim 1 further comprising:
generating output indicating when the hard-input decode circuit is full;
receiving user-input including a code rate value and a threshold control value;
identifying the decode threshold based on the received code rate value and threshold control value; and
storing the identified decode threshold.

12. A decoder comprising:
a hard-input decode circuit configured to receive a first Forward Error Correction (FEC) block of read values, each bit of the first FEC block of read values representative of a corresponding bit of a stored FEC block and start a hard-decode process, the hard-decode process including variable node processing and check node processing on the first FEC block of read values to identify a number of check node failures;
a decode controller coupled to the hard-input decode circuit, the decode-controller configured to compare the identified number of check node failures to a decode threshold during the hard-decode process, generate output indicating that the hard-input decode circuit is to stop the processing of the error correction code when the identified number of check node failures is greater than the decode threshold, and generate output indicating that additional reads are required when the identified number of check node failures is greater than the decode threshold,
wherein the hard-input decode circuit is operable, responsive to the output indicating that the hard-input decode circuit is to stop the processing of the error correction code, to stop the hard-decode process prior to completion of the hard-decode process;
a mapper configured to receive the first FEC block of read values and additional FEC blocks of read values responsive to the generated output indicating that additional reads are required and configured to map the first FEC block of read values and the additional FEC blocks of read values into soft-input values; and
a soft-input decode circuit coupled to the mapper, the soft-input decode circuit configured to perform a soft-decode process on the soft-input values to identify a decoded FEC block from the soft-input values.

13. The decoder of claim 12 wherein the decode controller is configured to compare the identified number of check node failures in a first iteration of a single-layer error correction code to the decode threshold and is configured to generate the output indicating that the hard-input decode circuit is to stop the processing of the error correction code when the identified number of check node failures in the first iteration of the error correction code is greater than the decode threshold.

14. The decoder of claim 12 wherein the decode controller is configured to compare the identified number of check node failures in a first layer of a first iteration to the decode threshold and is configured to generate the output indicating that the hard-input decode circuit is to stop the processing of the error correction code when the identified number of check node failures in the first layer of the first iteration of the error correction code is greater than the decode threshold.

15. The decoder of claim 12 wherein the decode controller is configured to identify the decode threshold based on a code rate value input by a user and a threshold control value input by the user.

16. The decoder of claim 12 wherein the decode controller is configured to identify the decode threshold by performing a look-up of the input code rate value and threshold control value in a stored look-up table to identify the corresponding decode threshold.

17. The decoder of claim 12 wherein the decode controller is configured to incrementally decrease the decode threshold when the hard-input decode circuit is full.

18. The decoder of claim 12 wherein the hard-decode process and the soft-decode process each comprise performing an error correction code selected from the group consisting of a Viterbi code, a Soft Output Viterbi Algorithm (SOVA) code, a Turbo code and a Low-Density Parity-Check (LDPC) code.

19. A memory controller comprising:
an input and output circuit;
an encoder configured for encoding data received at the input and output circuit into a Forward Error Correction (FEC) block;
a write circuit coupled to the encoder, the write circuit configured for storing the FEC block on non-volatile memory devices;
a read circuit configured for reading the stored FEC block;
a hard-input decode circuit configured to receive a first FEC block of read values, each bit of the first FEC block of read values representative of a corresponding bit of the stored FEC block and to start a hard-decode process, the hard-decode process including variable node processing and check node processing on the first FEC block of read values to identify a number of check node failures;
a decode controller coupled to the hard-input decode circuit, the decode controller configured to compare the identified number of check node failures to a decode threshold during the hard-decode process, generate output indicating that the hard-input decode circuit is to stop the processing of the error correction code when the identified number of check node failures is greater than the decode threshold, and generate output indicating that additional reads are required when the identified number of check node failures is greater than the decode threshold,
wherein the hard-input decode circuit is operable, responsive to the output indicating that the hard-input decode circuit is to stop the processing of the error correction code, to stop the hard-decode process prior to completion of the hard-decode process;
a mapper configured to receive the first FEC block of read values and additional FEC blocks of read values responsive to the generated output indicating that additional reads are required and configured to map the first FEC block of read values and the additional FEC blocks of read values into soft-input values; and
a soft-input decode circuit coupled to the mapper, the soft-input decode circuit configured to perform a soft-decode process on the soft-input values to identify the decoded FEC block.

20. The memory controller of claim 19 wherein the decode controller is configured to incrementally decrease the decode threshold when the hard-input decode circuit is full.

* * * * *

UNITED STATES PATENT AND TRADEMARK OFFICE
CERTIFICATE OF CORRECTION

PATENT NO. : 11,086,716 B2  
APPLICATION NO. : 16/790547  
DATED : August 10, 2021  
INVENTOR(S) : Peter John Waldemar Graumann Page 1 of 1

It is certified that error appears in the above-identified patent and that said Letters Patent is hereby corrected as shown below:

In the Specification

Column 12, Line 21, replace "1-BR" with --FER--.

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*